United States Patent [19]

Kawanishi et al.

[11] Patent Number: 4,966,281
[45] Date of Patent: Oct. 30, 1990

[54] ELECTRONIC COMPONENT CARRIER

[75] Inventors: Michirou Kawanishi; Kaoru Aizawa; Kyoichi Araki; Kiyohiro Kamei; Kunio Nagasaki, all of Osaka, Japan

[73] Assignee: Nitto Denko Corporation, Osaka, Japan

[21] Appl. No.: 393,177

[22] Filed: Aug. 14, 1989

[30] Foreign Application Priority Data

Sep. 9, 1988 [JP] Japan .............................. 63-118999[U]
Sep. 27, 1988 [JP] Japan .............................. 63-126816[U]
Jan. 13, 1989 [JP] Japan .................................. 1-2921[U]
Mar. 2, 1989 [JP] Japan ................................ 1-24581[U]

[51] Int. Cl.$^5$ ............................................. B65D 73/02
[52] U.S. Cl. ..................................... 206/330; 206/460
[58] Field of Search ........................ 206/330, 328, 460

[56] References Cited

U.S. PATENT DOCUMENTS 4,406,367  9/1983  Bouwknegt ......................... 206/460
4,411,362 10/1983  Itemadni et al. .................... 206/460
4,562,924  1/1986  Okamoto ............................. 206/460
4,657,137  4/1987  Johnson .............................. 206/460

FOREIGN PATENT DOCUMENTS 70370  9/1987  Japan ................................... 206/460

Primary Examiner—Joseph Man-Fu Moy
Attorney, Agent, or Firm—Sughrue, Mion, Zinn, Macpeak & Seas

[57] ABSTRACT

An electronic component carrier includes an elongated substrate having a series of electronic component-setting portions spaced from one another at a predetermined interval along the length of the substrate. The substrate has push bar-insertion holes formed therethrough and disposed respectively at the electronic component-setting portions. Adhesive layers are formed respectively on surfaces of the electronic component-setting portions. The electronic components are adapted to be bonded respectively to the electronic component-setting portions through the adhesive layers. A push bar is adapted to be inserted into the push bar-insertion hole so as to be engaged with the electronic component to release the same from the adhesive layer.

27 Claims, 4 Drawing Sheets

4,966,281

ELECTRONIC COMPONENT CARRIER

BACKGROUND OF THE INVENTION

1. Field of the Invention

This invention relates to an electronic component carrier for continuously transferring and feeding electronic components, such as an integrated circuit (IC) and a large-scale integrated circuit (LSI), to an applicator for applying them to circuit boards.

2. Prior Art

Electronic component carriers of the tape reel type have now been extensively used since they are considered to be best suited for automatic high-speed processing of electronic components. One such known carrier of the tape reel type comprises a tape-like substrate having a series of feed perforations formed through one lateral edge portion of the substrate and spaced equally from one another along the length of the substrate, and an adhesive layer formed either continuously or discontinuously on one side of the substrate, so that electronic components are bonded to the adhesive layer in spaced relation to one another.

In such a conventional carrier, although it is necessary that the electronic components be firmly bonded to the adhesive layer during the transfer thereof or during the storage thereof, the electronic components also need be smoothly removed from the adhesive layer when feeding them to the applicator for applying them to circuit boards. Thus, if an adhesive having a high adhesive strength is used so as to firmly hold the electronic components, then in contrast, the electronic components can not so easily be removed from the adhesive layer, thus failing to smoothly supply the electronic components to the applicator.

SUMMARY OF THE INVENTION

It is therefore an object of this invention to provide an electronic component carrier which overcome the above problems of the prior art.

According to the present invention, there is provided an electronic component carrier comprising:

(a) an elongated substrate having a series of electronic component-mounting portions spaced from one another at a predetermined interval along the length of the substrate, the substrate having push bar-insertion holes formed therethrough and disposed respectively at the electronic component-mounting portions; and (b) adhesive layers formed respectively on surfaces of said electronic component-mounting portions, electronic components being adapted to be bonded respectively to the electronic component-mounting portions through the adhesive layers.

DESCRIPTION OF THE PREFERRED EMBODIMENTS OF THE INVENTION

The invention will now be described with reference to the drawings.

Figure 1A:
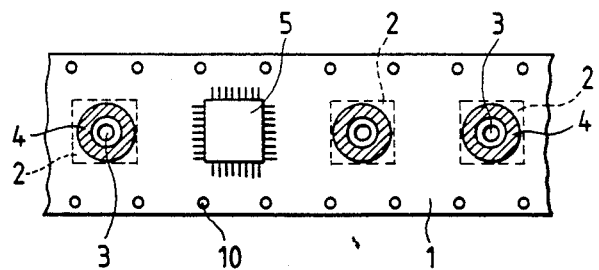
FIG. 1A is a fragmentary plan view of an electronic component carrier provided in accordance with the present invention.

An electronic component carrier shown in FIG. 1A comprises a tape-like substrate 1 having a suitable degree of flexibility. The substrate 1 has two rows of feed perforations 10 formed respectively through the opposite lateral edge portions of the substrate 1, the perforations 10 of each row being spaced at equal intervals from one another. The substrate 1 has at its one side a series of electronic component-mounting portions 2 disposed centrally of the width of the substrate 1 and spaced at a predetermined interval along the length of the substrate 1. The plane dimension of the electronic component-mounting portion 2 is substantially equal to the plane dimension of an electronic component 5 to be attached thereto. Push bar-insertion holes 3 are formed through the substrate 1 and are disposed at the central portions of the electronic component-mounting portions 2, respectively. The diameter of the push bar-insertion hole 3 is usually about 0.5 mm to about 10 mm.

An adhesive layer 4 of a ring-shape is formed on the surface of each electronic component-mounting portion 2 and disposed in surrounding relation to the hole 3. The adhesive layer 4 is made of an adhesive of the rubber type, the acryltype or the silicone type having suitable pressure-sensitive adhesive properties. The thickness of the adhesive layer 4 is usually about 1 μm to about 100 μm. The electronic component 5, such for example as a QFP-type (Quad Flat Package) LSI, is adhesively bonded to each adhesive layer 4.

Figure 1B:
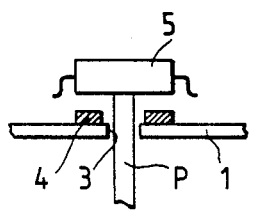
FIG. 1B is a cross-sectional view of the electronic component carrier, showing the removal of an electronic component from the carrier.

When the electronic components 5 held by the electronic component carrier of the above construction are to be supplied to an automatic applicator for applying them to circuit boards, the electronic components 5 are picked up and removed from the electronic component carrier by a suction nozzle. At this time, as shown in FIG. 1B, a push bar P is inserted through the hole 3 to push the electronic component 5 to facilitate the removal of the electronic component 5 from the adhesive layer 4. Thus, the use of the push bar P enables a smooth removal of the electronic component 5 from the adhesive layer 4.

The substrate 1 is made of a plastic film, (preferably a film which is subjected to an electrical conductive treatment by mixing a film and a carbon powder or the like,) which has a thickness of about 0.15 mm–1.0 mm and is made of polyethylene, polypropylene, hard polyvinyl chloride, polyester, polycarbonate and so on. Preferably, the substrate 1 has a suitable flexibility and a self-supportability (suitable rigidity) in which a bending elastic modulus is not less than 50 kg/mm$^2$. The term "bending elastic modulus" herein used is given by a calculation method and an experiment method (which is conducted under a condition in which a temperature is 23 degrees) prescribed in JIS-K6911.

The substrate 1 is composed of the above-mentioned plastic film, so that the carrier can be easily stored by winding and the electronic component 5 is easily released from the adhesive layer 4 due to the fact that bending transformation of the substrate 1 in the upward direction can be small when the electronic component 5 is pushed up.

Figure 2:
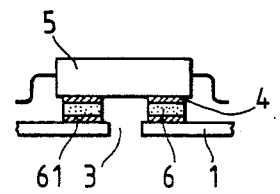
FIG. 2 is a cross-sectional view of a modified electronic component carrier.

FIG. 2 shows a modified electronic component carrier in which a cushioning layer 6 is interposed between the substrate 1 and the adhesive layer 4. More specifically, the cushioning layer 6 has an adhesive layer 61, and is bonded to the substrate 1 through the adhesive layer 61. With this construction, a deforming stress or an impact stress applied to the surface of the substrate 1 is absorbed and relieved by the cushioning layer 6. In addition, because of the cushioning ability of the cushioning layer 6, the adhesive layer 4 can be brought into intimate contact with an uneven surface of the electronic component 5, thereby firmly holding the electronic component 5 in a stable manner. The cushioning layer 6 can be made, for example, of an elastic foam of rubber and/or a synthetic resin, soft rubber, a thick non-woven fabric, or felt. The thickness of the cushioning layer 6 is about 0.05 mm to about 10 mm.

In the present invention, it is preferred that the adhesive layer 4 be provided at the marginal portion of the electronic component-mounting portion 2, as shown in FIGS. 1A and 1B. With such arrangement, the electronic component can be more positively held in position against an external impact acting in the direction of shear.

Figure 3A:
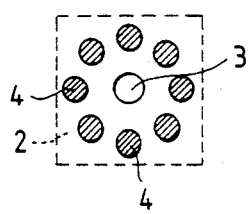
FIG. 3A is a plan view showing a modified arrangement of an adhesive layer means.

According to another modified form of the invention, an adhesive layer 4 may be divided into a plurality of discrete sections, so as to hold the electronic component 5 at a plurality of points. For example, as shown in FIG. 3A, the adhesive layer 4 is provided in the form of a circle of dots or spots. With this arrangement, even when the electronic component 5 is released from one or some of the adhesive dots, the component 5 can still be held in position by the other adhesive dots, and the component 5 can not be so easily released from the substrate 1 even when an external impact is applied to the electronic component 5 during storage or transport of the electronic component carrier holding the electronic components 5.

Figure 3B:
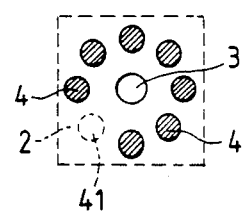
FIG. 3B is a plan view showing another modified arrangement of an adhesive layer means.

According to a further modified form of the invention, an adhesive layer 4 has an uneven distribution of the adhesive strength. For example, as shown in FIG. 3B, one adhesive dot 41 is omitted from the circle of adhesive dots shown in FIG. 3B. In the case where the adhesive layer 4 has a uniform distribution of the adhesive strength, when the electronic component 5 is pushed by the push bar P, a vertical releasing force is uniformly exerted on a concentric circle. However, in the case where the adhesive layer 4 has an uneven distribution of the adhesive strength as described above, the releasing force is applied with an uneven distribution of stress relative to the overall adhesive layer 4, and therefore the release of the electronic component 5 from the adhesive layer can be initiated easily.

Figure 4A:
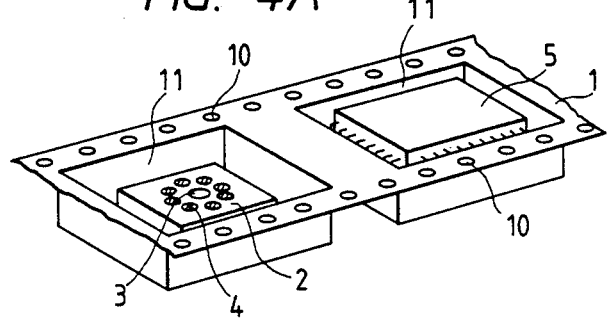
FIG. 4A is a fragmentary perspective view of another modified electronic component carrier.
Figure 4B:
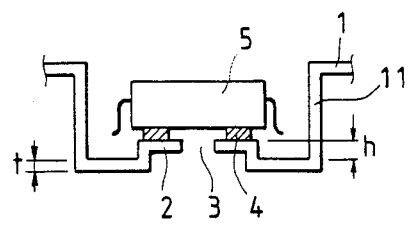
FIG. 4B is a cross-sectional view of the electronic component carrier of FIG. 4A.

FIGS. 4A and 4B show a further modified electronic component carrier. More specifically, a substrate 1 has a number of cavity portions 11 spaced at a predetermined interval from one another along the length of the substrate 1, each cavity portion 11 being defined by a peripheral and a bottom wall. The central portion of the bottom wall of each cavity portion 11 is raised or stepped upwardly toward its opening, and an upper section of this raised portion serves as an electronic component-mounting portion 2. A push bar- insertion hole 3 is formed through the electronic component-mounting portion 2. The substrate 1 is formed by suitably shaping a plastics film, made, for example, of polystyrene, polypropylene, rigid polyvinyl chloride, polyester, or polycarbonate. The thickness of the plastics film is about 0.15 mm to about 1.0 mm. It is preferred that the plastic film be subjected to an electrically conductive treatment, for example, by adding carbon powder to the material of such plastic film. In addition, preferably, the substrate (1) has a suitable flexibility and a self-supportability (suitable rigidity) in which a bending elastic modulus is not less than 50 kg/mm$^2$. In this embodiment, the two stepped portions, which perform the function of ribs and define the cavity portion 11 and the raised portion (electronic component- mounting portion) 2, respectively, are provided around the electronic component 5. Therefore, the bending strain developing in the bonding surface (the electronic component- mounting portion 2) due to an external bending force can be relieved. Therefore, even if the substrate 1 is subjected to a bending strain when passing past rolls or the like, the electronic component 4 bonded to the adhesive layer is not so easily released therefrom. In order to achieve such effects more effectively, it is preferred that the plane dimension of the electronic component-mounting portion 2 raised as shown in FIG. 4B is substantially equal to the plane dimension of the electronic component 5 (Preferably, the difference is not more than ±20%). Also, preferably, the height h of the electronic component-mounting portion 2 (that is, the amount of projecting of this portion 2 from the bottom wall of the cavity portion 11) is 1 to 50 times greater than the thickness t of the substrate 1. If the plane dimension of the raised portion 2 is substantially equal to the plane dimension of the plane dimension of the electronic component 5, an right-angular corner portion is not provided between the portion 2 and the electronic component 5. Therefore, even when an external bending force is applied to the substrate 1, there is not encountered a stress concentration which would otherwise be caused by the notch effect due to such a right-angular corner portion. Also, if the height h of the electronic component- mounting portion 2 is 1 to 50 times greater than the thickness of the substrate 1, its stepped portion can perform the function of a rib which withstands an external bending force, thereby relieving the deformation of the electronic component- mounting portion 2 which would be caused by such external bending force. Therefore, the effect of such bending deformation on the interface between the electronic component- mounting portion 2 and the adhesive layer 4 is relieved, thereby preventing the portion 2 from being released from the substrate 1.

Figure 5:
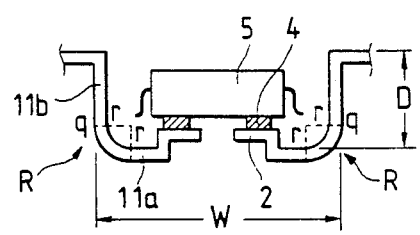
FIG. 5 is a cross-sectional view of a further modified electronic component carrier.
Figure 12A:
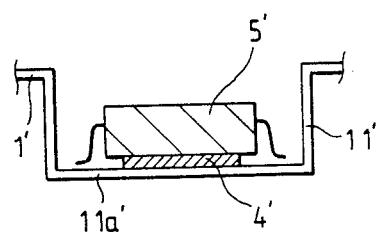
FIG. 12A is a cross-sectional view of a conventional electronic component carrier before an electronic component is removed therefrom.
Figure 12B:
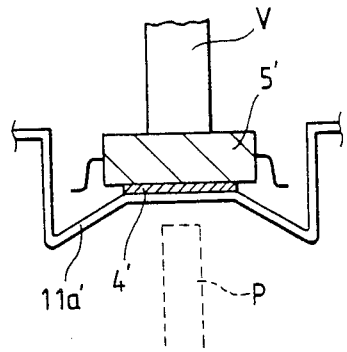
FIG. 12B is a cross-sectional view of the conventional electronic component carrier after the electronic component is removed.

FIG. 5 shows a further modified electronic component carrier which differs from the electronic component carrier of FIGS. 4A and 4B in that a corner portion where the bottom wall 11a and the peripheral wall 11b of a cavity portion 11 are merged together is arcuately curved as at R. The advantages of the carrier having the curved portion R over carriers with no such curved portion will now be described. FIGS. 12A and 12B show the manner in which an electronic component 5, is removed from a conventional electronic component carrier. More specifically, when the electronic component 5' is to be released from an adhesive layer 4', the electronic component 5' is held by a suction nozzle V, and is picked up. At this time, optionally, the electronic component 5' is pushed by a push bar P. During this suction operation, the suction force is applied to the bottom wall 11a' of a cavity portion 11' through the adhesive layer 4'. Generally, the material of the substrate 1' is thin so that it can be easily shaped or formed into a predetermined configuration having the cavity portion. Therefore, a deforming stress is exerted on the bottom wall 11a' in the direction f of the suction. As a result, since a corner portion C where the bottom wall 11a' and the peripheral wall 11b' jointly constituting the cavity portion 11' are merged together is substantially right-angular, the bottom wall 11a' is deformed or turned about the corner portion C in the direction of release of the electronic component 5', as shown in FIG. 12B. Particularly where the cavity portion 11' is of a large size, the amount of such deformation is 3 to 5 mm. Thus, the position of release is displaced, and therefore the release of the electronic components 5' can not be carried out smoothly.

On the other hand, when there is provided the arc-shaped curved corner portion R where the bottom wall 11a and the peripheral wall 11b are merged together, the curved corner portion R absorbs and relieves the deflection stress exerted on the bottom wall 11a. Therefore, even when the electronic component 5 is attracted by a suction nozzle or the like, the bottom wall 11a is hardly deformed, and the position of release is not displaced so much, thereby achieving a smooth release of the electronic component.

The dimension of the curved corner portion R is represented by a radius r of curvature of its outer surface. In FIG. 5, the ratio of the curvature radius s to the depth D of the cavity 11 (r/D) is not less than 1/10, and more preferably in the range of between 1/5 and 4/5. Here, "W" represents the distance between two points q and q (on the opposite longer side walls) at which the curvature of the peripheral wall 11b start. The ratio of r/W is in the range of between 1/70 and 1/5, and more preferably in the range of between 1/35 and 1/10. If the ratio of r/D and the ratio of r/W are less than 1/10 and 1/70, respectively, the bottom wall 11a can not sufficiently relieve a deforming stress applied thereto.

Usually, the depth D of the cavity portion is 3 to 10 mm, and the distance W is 15 to 50 mm.

Figure 6A:
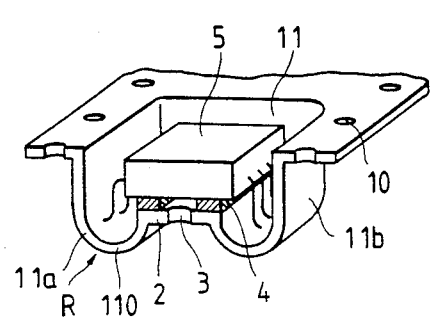
FIG. 6A is a fragmentary perspective view of a further modified electronic carrier.
Figure 6B:
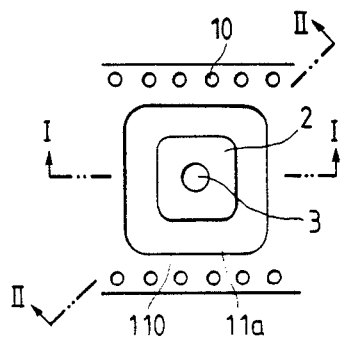
FIG. 6B a fragmentary schematic plan view of the electronic component carrier of FIG. 6A.
Figure 6C:
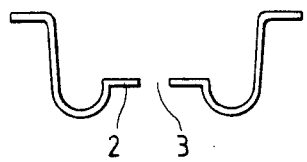
FIG. 6C is a cross-sectional view taken along the line I—I of FIG. 6B.
Figure 6D:
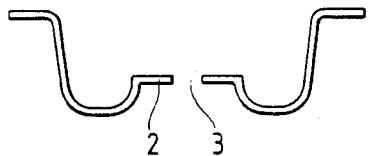
FIG. 6D is a cross-sectional view taken along the line II—II of FIG. 6B.
Figure 7A:
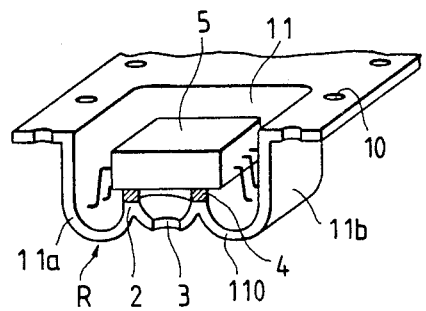
FIG. 7A is a fragmentary perspective view of a further modified electronic component carrier.
Figure 7B:
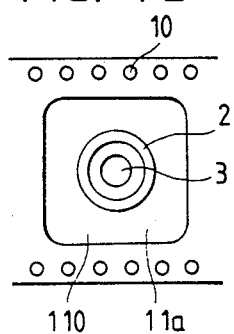
FIG. 7B is a fragmentary schematic plan view of the electronic component carrier of FIG. 7A.

FIGS. 6A and 6B show a further modified electronic component carrier which differs from the electronic component carrier of FIG. 5 in that that portion 110 of the bottom wall 11a of the cavity portion 11 extending between the electronic- mounting portion 2 and the peripheral wall 11b of the cavity portion 11 is arcuately curved outwardly to provide an arc-shaped curved portion R. The curvature of this arc-shaped curved portion R can be uneven (i.e., not uniform), as shown in FIGS. 6C and 6D. The dimension of the curved portion R is suitably determined as described above, using its shape of FIG. 6C as a reference. With these constructions, when the electronic component 5 is pushed by the push bar, the stress is absorbed and relieved by the curved portion R, and therefore the electronic component-mounting portion 2 will not be deformed or displaced upwardly, thus preventing the position of release of the electronic component 5 from being displaced or changed. In this case, as shown in FIGS. 7A and 7B, the electronic component-mounting portion 2 can be bulged downwardly to provide an annular mounting portion on which the electronic component 5 is mounted at its marginal portion through the adhesive layer 4. With this arrangement, the electronic component 5 can be stably fixed to the carrier and also can be more smoothly released from the adhesive layer 4 by the push bar.

Next, specific examples of the electronic component carrier of the present invention having the cavity portion 11 will now be described. A polystyrene film having a thickness of 0.4 mm was formed by vacuum forming into the shape of the substrate shown in FIG. 5 to provide a substrate. A plurality of such substrates were prepared. Each of the four sides of the resultant cavity portion was 28 mm, and its depth was 5 mm. Each of the four sides of an electronic component- mounting portion was 15 mm, and its height was 1 mm. A push bar-insertion hole had a diameter of 3 mm. There were formed curved corner portions of various sizes (shown in TABLE 1) constituted respectively by the bottom and peripheral walls of the cavity portions. An adhesive layer having a thickness of 0.03 mm was formed on the electronic component-mounting portion of each of the substrates, and an electronic component (QFP-type LSI) was bonded to the adhesive layer. Then, the electronic component:-pickup ratio was measured with respect to all the electronic component carriers thus prepared. More specifically, it was determined whether or not after the push bar was brought into contact with the electronic component, the electronic component was released from the adhesive layer when the push bar was further advanced or pushed by a distance of 5 mm.

The electronic component-pickup ratio was calculated from the following formula:

$$\text{The pickup ratio} = \frac{\text{The number of releases}}{\text{The number of tests}}$$

Comparative examples were prepared according to the same procedure except that the curved portion was not provided. With respect to Comparative example 1, a substrate was formed using a film having a thickness of 0.4 mm, and with respect to Comparative example 2, a substrate was formed using a film having a thickness of 0.3 mm. The test results of the examples and the comparative examples are shown in TABLE 1.

TABLE 1

|  | Size of Curvature | | Electronic component pickup Ratio |
|---|---|---|---|
|  | r/D | r/W |  |
| Example 1 | 1/10 | 1/56 | 8/10 |
| Example 2 | 1/5 | 1/28 | 10/10 |
| Example 3 | 2/5 | 2/28 | 10/10 |
| Comparative Example 1 | — | — | 5/10 |
| Comparative Example 2 | — | — | 3/10 |

Under similar conditions, other substrates were formed in the shape shown in FIGS. 6A and 6B, and bottom portions of the substrates were entirely curved in the widthwise direction, using the cross-section of FIG. 6C as a reference. The curvatures of those curved portions corresponded respectively to the curvatures of the curved portions of the above- mentioned Examples 1, 2 and 3. When the electronic component- pickup ratio was calculated with respect to those examples, their ratios were all 10/10.

Figure 8A:
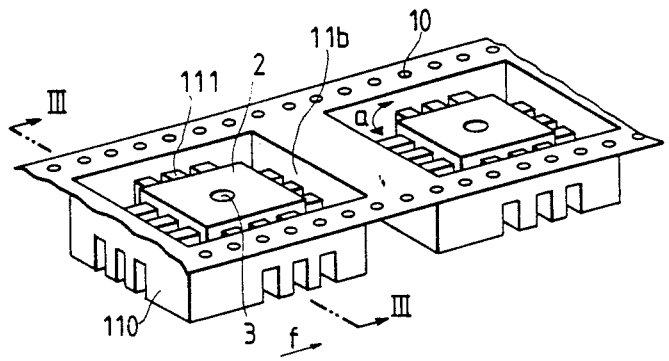
FIG. 8A is a fragmentary perspective view of a further modified electronic component carrier.
Figure 8B:
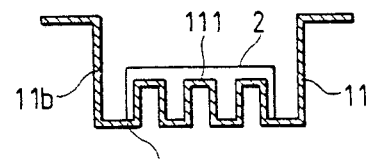
FIG. 8B is a cross-sectional view taken along the line III—III of FIG. 8A, as viewed in a direction f.

FIGS. 8A to 11C show further modified electronic component carriers, respectively. In FIGS. 8A and 8B, reference numeral 11 denotes a valley portion formed by a peripheral wall 11b of a cavity portion 11 and that portion 110 of a bottom wall of the cavity portion which extends between an electronic component-mounting portion 2 and the peripheral wall 11b. The surface of the valley portion 111 is corrugated in the direction of the periphery of the electronic component-mounting portion 2 as indicated by an arrow a (For example, the cross-section of each corrugation is rectangular). In other words, the valley portion 111 is uneven in the peripheral direction. The electronic component is received within the cavity portion 11 and is bonded to the electronic component-mounting portion 2 through an adhesive layer. When the electronic component is to be picked up by a suction nozzle, a push bar, etc., the moment acts on the valley portion uniformly in its peripheral direction. The direction of this moment is in the peripheral direction, and although the valley portion 111 is bent or deformed upwardly, the bending strain developing in the valley portion is uneven, because the surface of the valley portion 111 is uneven in its peripheral direction. Therefore, the valley portion 111 can not be so easily bent or deformed and has an increased rigidity withstanding the bending deformation. With this construction, when picking up the electronic component, a sufficiently-increased vertical stress is allowed to develop between the electronic component and the adhesive layer, and therefore the electronic component can be easily released and picked up.

Figure 9A:
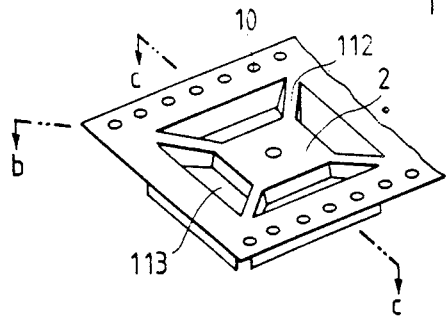
FIG. 9A is a fragmentary perspective view of a further modified electronic component carrier.
Figure 9B:
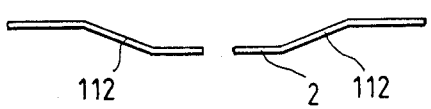
FIG. 9B is a cross-sectional view taken along the line b—b of FIG. 9A.
Figure 9C:
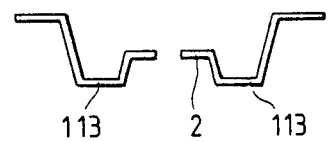
FIG. 9C is a cross-sectional view taken along the line c—c of FIG. 9A.
Figure 10A:
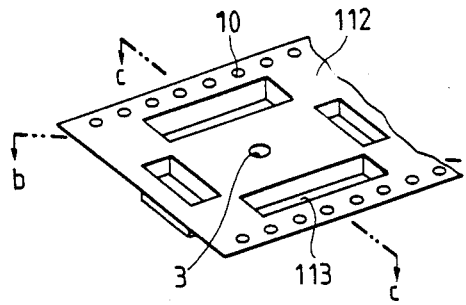
FIG. 10A is a fragmentary perspective view of a further modified electronic component carrier.
Figure 11A:
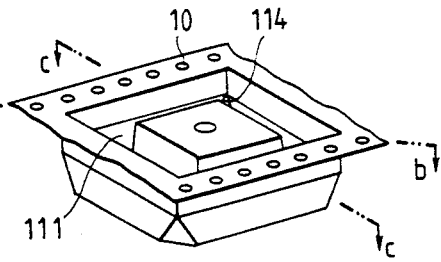
FIG. 11A is a fragmentary perspective view of a further modified electronic component carrier.
Figure 10B:
FIG. 10B is a cross-sectional view taken along the line b—b of FIG. 10A.
Figure 11B:
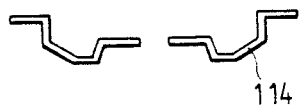
FIG. 11B is a cross-sectional view taken along the line b—b of FIG. 11A.
Figure 10C:
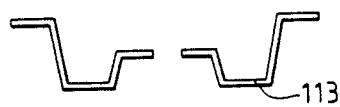
FIG. 10C is a cross-sectional view taken along the line c—c of FIG. 10A.
Figure 11C:
FIG. 11C is a cross-sectional view taken along the line c—c of FIG. 11A.

So long as the valley portion 111 has an uneven surface in the peripheral direction, it may have any shape. For example, as shown in FIGS. 9A, 9B and 9C, four shallow tapered surfaces 112 can be provided at four right-angular corners cf a square-shaped valley portion 111, and a deeply-recessed surface 113 is formed between each two adjacent tapered surfaces 112. Also, as shown in FIGS. 10A, 10B and 10C, the the shallow tapered surfaces 112 can be wider, that is, increased in size. Further, as shown in FIGS. 11A, 11B and 11C, an inclined surface 114 can be provided on each of the four corners of the square-shaped valley 111.

In the electronic component carriers according to the present invention, the electronic components are firmly bonded adhesively to the substrate during the transfer of the electronic components, and therefore the electronic components are accurately maintained in position. In addition, when the electronic component is to be fed to an automatic electronic component applicator, the electronic component can be easily picked up by means of the push rod or other suitable means, thus achieving a high-speed processing of the components.

What is claimed is:

1. An electronic component carrier comprising:
   (a) an elongated substrate having a series of electronic component-setting portions spaced from one another at a predetermined interval along the length of said substrate, said substrate having push bar-insertion holes formed therethrough and disposed respectively at said electronic component-setting portions; and
   (b) adhesive layers formed respectively on surfaces of said electronic component-setting portions, electronic components being adapted to be bonded respectively to said electronic component-setting portions through said adhesive layers.

2. An electronic component carrier according to claim 1, in which said elongated substrate is made of a flexible plastic film having a bending elastic modulus which is not less than 50 kg/mm².

3. An electronic component carrier according to claim 1, in which a cushioning layer is interposed between said substrate and said adhesive layer.

4. An electronic component carrier according to claim 1, in which each of the adhesive layers is formed on a marginal portion of the surface of a respective one of said electronic component-setting portions.

5. An electronic component carrier according to claim 1, in which said adhesive layer is divided into a plurality of sections spaced apart form one another, so that the electronic component can be bonded to said electronic component-setting portion at a plurality of points.

6. An electronic component carrier according to claim 1, in which said adhesive layer has an uneven distribution of an adhesive strength with respect to the surface of said electronic component-setting portion.

7. An electronic component carrier according to claim 1, in which said substrate has a series of cavity portions spaced from one another at a predetermined interval along the length of said substrate, said cavity portion having an open top and being formed by a bottom wall and a peripheral wall, said bottom wall being raised at its central portion toward said open top, and an upper section of said raised portion serving as said electronic component-setting portion.

8. An electronic component carrier according to claim 1, in which said elongated substrate is made of a flexible plastic film having a bending elastic modulus which is not less than 50 kg/mm², wherein each of the adhesive layers is formed on a marginal portion of the surface of a respective one of said electronic component-setting portions.

9. An electronic component carrier according to claim 3, in which each of the adhesive layers is formed on a marginal portion of the surface of a respective one of said electronic component-setting portions.

10. An electronic component carrier according to claim 3, in which said adhesive layer is divided into a plurality of sections spaced apart from one another, so that the electronic component can be bonded to said electronic component-setting portion at a plurality of points.

11. An electronic component carrier according to claim 3, in which said adhesive layer has an uneven distribution of an adhesive strength with respect to the surface of said electronic component-setting portion.

12. An electronic component carrier according to claim 4, in which said adhesive layer is divided into a plurality of sections spaced apart from one another, so that the electronic component can be bonded to said electronic component-setting portion at a plurality of points.

13. An electronic component carrier according to claim 4, in which said adhesive layer has an uneven distribution of an adhesive strength with respect to the surface of said electronic component-setting portion.

14. An electronic component carrier according to claim 5, in which said adhesive layer has an uneven distribution of an adhesive strength with respect to the surface cf said electronic component-setting portion.

15. An electronic component carrier according to claim 12, in which said adhesive layer has an uneven distribution of an adhesive strength with respect to the surface of said electronic component-setting portion.

16. An electronic component carrier according to claim 9, in which said adhesive layer has an uneven distribution of an adhesive strength with respect to the surface of said electronic component-setting portion.

17. An electronic component carrier according to claim 7, in which the dimension of the surface of said electronic component-setting portion is substantially equal to the size of the electronic component, the height of said raised portion being 1 to 50 times greater than the thickness of said substrate.

18. An electronic component carrier according to claim 7, in which a corner portion where said bottom wall and peripheral wall of said cavity portion are merged together is arcuately curved.

19. An electronic component carrier according to claim 7, in which that portion of said bottom wall of said cavity portion which extends between said electronic component-setting portion and said peripheral wall of said cavity portion is curved.

20. An electronic component carrier according to claim 7, in which a valley portion is formed by said peripheral wall of said cavity portion and that portion of said bottom wall of said cavity portion which extends between said electronic component-setting portion and said peripheral wall, a surface of said valley portion being corrugated in the direction of the periphery of said electronic component- setting portion.

21. An electronic component carrier according to claim 17, in which a corner portion where said bottom wall and peripheral wall of said cavity portion are merged together is arcuately curved.

22. An electronic component carrier according to claim 17, in which that portion of said bottom wall of said cavity portion which extends between said electronic component-setting portion and said peripheral wall of said cavity portion is curved.

23. An electronic component carrier according to claim 17, in which a valley portion is formed by said peripheral wall of said cavity portion and that portion of said bottom wall of said cavity portion which extends between said electronic component-setting portion and said peripheral wall, a surface of said valley portion being corrugated in the direction of the periphery of said electronic component- setting portion.

24. An electronic component carrier according to claim 18, in which the ratio of the curvature radius of an outer surface of said curved portion to the depth of said cavity portion is not less than 1/10, said peripheral wall being defined by a pair of opposed shorter side walls and a pair of opposed longer side walls, and the ratio of said curvature radius to the distance between two points disposed respectively on the outer surfaces of said opposite longer side walls at which points the curvature starts being in the range of between 1/70 and 1/5.

25. An electronic component carrier according to claim 19, in which the ratio of the curvature radius of an outer surface of said curved portion to the depth of said cavity portion is not less than 1/10, said peripheral wall being defined by a pair of opposed shorter side walls and a pair of opposed longer side walls, and the ratio of said curvature radius to the distance between two points disposed respectively on the outer surfaces of said opposite longer side walls at which points the curvature starts being in the range of between 1/70 and 1/5.

26. An electronic component carrier according to claim 21, in which the ratio of the curvature radius of an outer surface of said curved portion to the depth of said cavity portion is not less than 1/10, said peripheral wall being defined by a pair of opposed shorter side walls and a pair of opposed longer side walls, and the ratio of said curvature radius to the distance between two points disposed respectively on the outer surfaces of said opposite longer side walls at which points the curvature starts being in the range of between 1/70 and 1/5.

27. An electronic component carrier according to claim 22, in which the ratio of the curvature radius of an outer surface of said curved portion to the depth of said cavity portion is not less than 1/10, said peripheral wall being defined by a pair of opposed shorter side walls and a pair of opposed longer side walls, and the ratio of said curvature radius to the distance between two points disposed respectively on the outer surfaces of said opposite longer side walls at which points the curvature starts being in the range of between 1/70 and 1/5.

* * * * *